United States Patent
Baker et al.

(10) Patent No.: US 7,683,650 B1
(45) Date of Patent: Mar. 23, 2010

(54) MEASUREMENT INSTRUMENT WITH SYNCHRONIZED INTERFERENCE SIGNALS

(75) Inventors: Dan Baker, Medina, OH (US); Michael D. Rayman, Akron, OH (US); Gregory Sobolewski, Seven Hills, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 60 days.

(21) Appl. No.: 11/753,323

(22) Filed: May 24, 2007

(51) Int. Cl.
*G01R 31/26* (2006.01)
*G01R 31/28* (2006.01)

(52) U.S. Cl. .................................. 324/765; 324/158.1
(58) Field of Classification Search ......... 324/754–765, 324/771, 158.1
See application file for complete search history.

(56) References Cited

U.S. PATENT DOCUMENTS

| | | | | |
|---|---|---|---|---|
| 4,780,670 A | * | 10/1988 | Cherry | 324/754 |
| 4,836,681 A | * | 6/1989 | Van Saders et al. | 356/619 |
| 5,177,351 A | * | 1/1993 | Lagowski | 250/215 |
| 5,406,214 A | * | 4/1995 | Boda et al. | 324/765 |
| 6,034,952 A | * | 3/2000 | Dohi et al. | 370/335 |
| 6,339,340 B1 | * | 1/2002 | Hsu | 324/771 |
| 6,667,631 B2 | * | 12/2003 | Ivanov | 324/762 |
| 7,049,843 B2 | * | 5/2006 | Yakymyshyn et al. | 324/765 |
| 7,098,682 B2 | * | 8/2006 | Sasaki | 324/765 |

* cited by examiner

*Primary Examiner*—Ha Tran T Nguyen
*Assistant Examiner*—Joshua Benitez
(74) *Attorney, Agent, or Firm*—Pearne & Gordon LLP

(57) ABSTRACT

An instrument for measuring electrical parameters includes a measurement section having a measurement aperture; and a support section providing at least one of power and digital control for the measurement section. The support section has an interference signal frequency, wherein the interference frequency is an integer multiple of the reciprocal of the measurement aperture and the measurement aperture and the interference signal are phase-locked. As a result, the effect of the interference signal on electrical parameters measured is minimized.

7 Claims, 1 Drawing Sheet

MEASUREMENT INSTRUMENT WITH SYNCHRONIZED INTERFERENCE SIGNALS

BACKGROUND OF THE INVENTION

The present invention relates to instruments for electrical measurement and, in particular, to the minimization of the effects off interfering signals.

Measurement instruments for making electrical measurements, particularly high accuracy and/or low level measurement can be adversely affected by interference from signals generated by the instruments themselves. For example, power supplies, particularly switching power supplies, may generate substantial interference. As a further example, digital logic control circuitry may do the same. The high frequency content of such signals tends to make it difficult to isolate these signals from the measurement section of the instrument.

It is even more of a problem when attempts are made to miniaturize an instrument and/or to more densely arrange instruments. One desirable configuration is to design instruments that can be implemented on cards suitable for use in devices such as personal computers. However, it is difficult to provide power and control of the measurement section while maintaining measurement integrity.

SUMMARY OF THE INVENTION

An instrument for measuring electrical parameters includes a measurement section having a measurement aperture; and a support section providing at least one of power and digital control for the measurement section. The support section has an interference signal frequency, wherein the interference frequency is an integer multiple of the reciprocal of the measurement aperture and the measurement aperture and the interference signal are phase-locked. As a result, the effect of the interference signal on electrical parameters measured is minimized.

DESCRIPTION OF THE PREFERRED EMBODIMENTS

Figure 1:
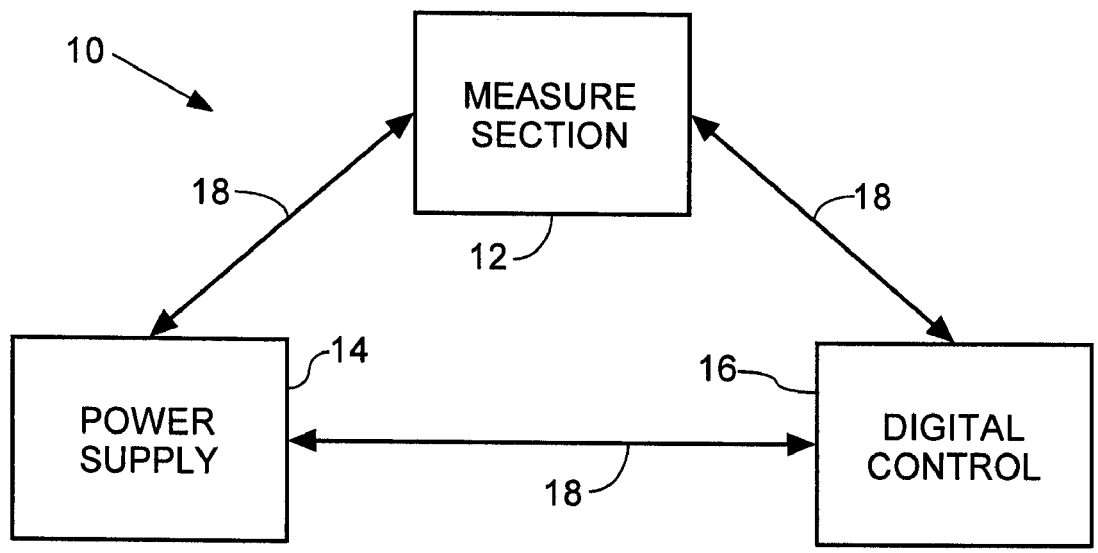
FIG. 1 is a block diagram of an example of an instrument according to the invention.

Referring to FIG. 1, a measurement instrument 10 includes a measurement section 12, a power supply section 14 and digital control section 16. A synchronization link 18 interconnects the sections 12, 14, 16.

The measurement section 12 includes circuitry for performing the measurement of one or more of a desired electrical parameter, for example, voltage or current. The measurement section 12 performs the desired measurement in a periodic time window or measurement aperture.

Figure 2:
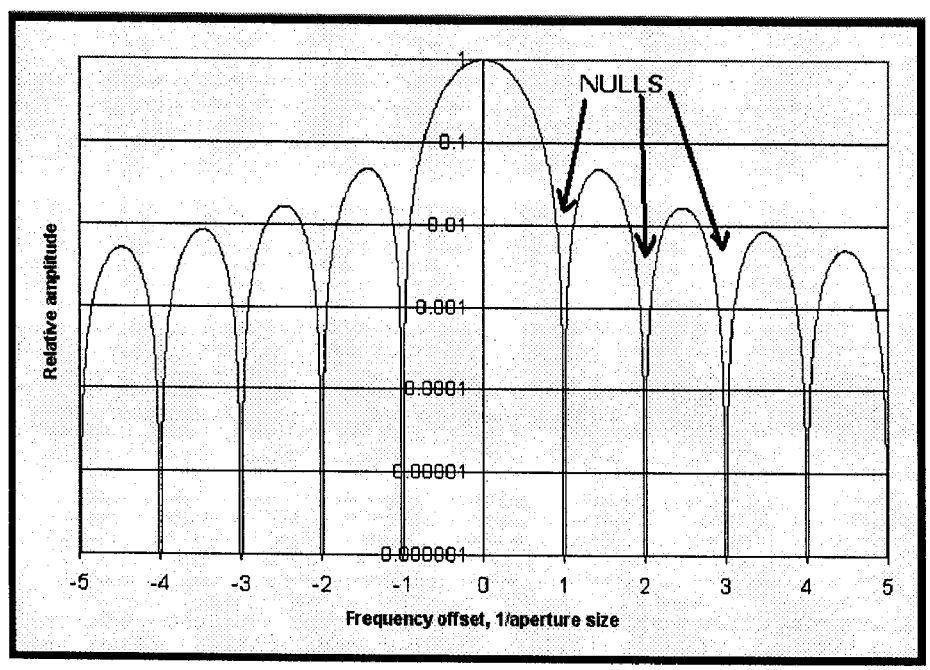
FIG. 2 is graph of an example of the sensitivity of a measurement instrument as a function of the reciprocal of the aperture window of the instrument.

FIG. 2 illustrates an example of the sensitivity with respect to frequency (e.g., the reciprocal of the measurement aperture) of such a measurement section (actually the offset from the measurement frequency of interest). Nulls occur at the reciprocal of the measurement aperture and at the harmonics of this frequency.

The power supply section 14 and the digital control circuitry section 16 may be considered support sections for the measurement section 12. For example, the power supply section 14 may provide the power for operation of the measurement section 12 and the digital control section 16 may control the operation of the measurement section 12, including moving data to and from the measurement section 12. These support sections will typically generate signals that can interfere with the measurement section. For example, the digital control section 16 will likely generate substantial interference signal frequencies at the clock frequency of the circuitry and the harmonics thereof. Similarly, the power supply may produce substantial interference signal frequencies related to its operation and harmonics thereof. In the case of switching power supplies there will typically be strong signals related to the switching frequency and its harmonics.

In order to minimize the effect of these interfering signals on measurements made by the instrument 10, the operation of the sections 12, 14, 16 are synchronized. This results in the frequency content of the interfering signals being located at the sensitivity nulls of the measurement section 12.

The measurement section and a support section either have an oscillator each for providing the necessary frequencies for operation or share an oscillator. One of the sections is chosen to provide the "master" frequency and the other signal frequencies are phase-locked to the master frequency using the synchronization link 18 between the sections. It is also possible for the synchronization link 18 to provide its own master frequency, for example, by including a reference oscillator as part of the link. In order to minimize the deleterious effects of the interference frequencies, the support section frequencies are chosen to be integer multiples of the reciprocal of the measurement aperture.

It is possible to move the frequencies of the sections around to avoid interference at a desired frequency component of a parameter to be measured. This can be a specific design frequency, or variable frequency adjustment circuitry that is adjusted manually or automatically as needed.

It should be noted that the interfering signals also have harmonics that can also interfere with the measurements. These harmonics should also fall into the nulls of the measurement section frequency response.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. An instrument for measuring electrical parameters, said apparatus comprising:
   a measurement section having a measurement aperture; and
   a support section providing at least one of power and digital control for said measurement section, said support section including an interference signal that interferes with said measuring, said interference signal having a frequency, wherein at least one of the interference signal frequency and the reciprocal of said measurement aperture are chosen so that the interference signal frequency is an integer multiple of the reciprocal of said measurement aperture and said measurement aperture and said interference signal are phase-locked, whereby the effect of said interference signal on electrical parameters measured is minimized.

2. An instrument according to claim 1, wherein the support section provides a master frequency.

3. An instrument according to claim 1, wherein the measurement section provides a master frequency.

4. An instrument according to claim 1, further comprising a synchronization link wherein said link provides a master frequency.

5. An instrument according to claim 1, wherein said interference signal frequency is adjustable to avoid a desired frequency component of a parameter to be measured.

6. An instrument according to claim 1, wherein said support section is a switching power supply.

7. An instrument according to claim 1, wherein said support section is a digital control circuit for said instrument.

* * * * *